United States Patent

[11] 3,624,638

[72] Inventors John H. Riseman Cambridge; Harold S. Goldberg, Lexington; John Grimes, Framingham, all of Mass.

[21] Appl. No. 74,729

[22] Filed Sept. 23, 1970

[45] Patented Nov. 30, 1971

[73] Assignee Orion Research, Inc. Cambridge, Mass.

[54] SIGNAL-CONVERTING METHOD AND APPARATUS

12 Claims, 4 Drawing Figs.

[52] U.S. Cl. ....................340/347 AD, 235/183, 340/347 NT

[51] Int. Cl. .................... H03k 13/02

[50] Field of Search .................... 340/347 AD, 347 NT; 235/183; 324/99, 111; 328/151, 189

[56] References Cited

UNITED STATES PATENTS

| | | | |
|---|---|---|---|
| 3,458,809 | 7/1969 | Dorey | 340/347 |
| 3,484,593 | 12/1969 | Schmoock et al. | 340/347 |
| 3,555,298 | 1/1971 | Neelands | 340/347 AD |
| 3,566,265 | 2/1971 | Reid | 340/347 AD |
| 3,566,397 | 2/1971 | Walton | 340/347 AD |

*Primary Examiner*—Thomas A. Robinson

*Attorneys*—Robert J. Schiller and Schiller & Pandiscio

ABSTRACT: A method and apparatus for converting an input analog signal to an antilog output signal which comprises the generation of a linear ramp signal which increases toward a predetermined response level. A clock signal having a predetermined cycle is provided so that when coincidence is detected between the ramp signal and the input signal, an exponential signal asymptotically approaching a predetermined amplitude with a time constant of predetermined value is then generated until the clock signal reaches the end of its predetermined cycle. At that time, a second linear ramp signal having an instantaneous absolute value of slope determined in accordance with the absolute value of slope of the first ramp signal and an initial absolute value determined in accordance with the absolute amplitude value of the exponential signal at the end of the predetermined cycle is generated. The antilog output signal is proportional to the time period measured from the end of the predetermined cycle until coincidence occurs between the second ramp signal and a reference signal which has a predetermined relationship to the input analog signal.

JOHN H. RISEMAN
HAROLD S. GOLDBERG
JOHN GRIMES
INVENTORS.

BY Schiller & Pandiscio
ATTORNEYS.

PATENTED NOV 30 1971

3,624,638

JOHN H. RISEMAN
HAROLD S. GOLDBERG
JOHN GRIMES
INVENTORS.

BY Schiller & Pandiscio
ATTORNEYS.

SIGNAL-CONVERTING METHOD AND APPARATUS

This invention relates to signal conversion systems and more particularly to converting an input analog signal containing logarithmic components to antilog output signals either in digital or analog form.

Conversion from input analog logarithmic signals to antilog output signals is desirable in such equipment as spectrometers, electrochemical detectors and many other types of measuring instruments. Digital conversion is particularly desirable for ease in reading an output display device.

In many prior art analog-to-digital antilog converters, either logarithmic diodes or logarithmic amplifiers are used to convert the input analog signal which is proportional to the log of the argument, to an analog signal which is the antilog of the input. This second signal can be linearly digitized to provide the output signal. However, these logarithmic diodes and logarithmic amplifiers may introduce error into the conversion. This error is introduced due to the gain instability and drift inherent in many of these types of logarithmic devices. Further, such logarithmic diodes and logarithmic amplifiers suffer from the inherent disadvantage that true logarithmic response to input signals is limited to a small dynamic range of the operating characteristics of such devices imposing severe and undesirable restrictions on the range of input signals which such apparatus may accommodate.

In many applications, such a high degree of error is intolerable. For example, in potentiometric electrochemical detectors, the activity of certain types of ions in solution is detected in the form of an analog electrical signal which varies logarithmically with the activity. When the latter is being electrochemically determined for purposes of online monitoring and control of chemical processing, the introduction of errors in the conversion of the signal to its antilog is apt to undesirably influence and affect the process control. Therefore, it is highly desirable to be able to perform the analog-to-digital antilog conversion with a minimum of conversion error.

It is an object of the present invention to provide an improved method and apparatus for converting an analog input signal to an antilog output signal. Another object of the present invention is to provide a method and apparatus for providing antilog conversion essentially unrestricted in dynamic range. Another object of the present invention is to provide such a method and apparatus wherein the conversion is analog-to-digital.

Yet another object of the present invention is to provide a method and apparatus for analog-to-digital antilog conversion in which an input analog electrical signal containing a logarithmic component is converted to a digital antilog output without the need for using logarithmic diodes, logarithmic amplifiers or the like.

Still another object of the present invention is to provide an improved method and apparatus for analog-to-digital antilog conversion in which a minimal conversion error is introduced due to amplifier or component drift.

Finally, another object of the present invention is to provide an improved method and apparatus for analog-to-digital antilog conversion for use with spectrometers, electrochemical detectors, and other types of such measuring instruments in which it is necessary to convert very accurately and simply an electrical input analog signal having a logarithmic component, into a digital antilog output signal representative of the input signal without introducing any appreciable signal conversion error.

The problems and disadvantages of the prior art are overcome by the present invention which basically utilizes a time-base encoding technique. Such a technique uses a linear ramp function which is compared with the input signal. The advantages in this invention in using a time-base encoding are ease of construction, simplicity of circuitry, and use of only a few basic circuits. Stability is a function solely of short term clock frequency stability, comparator stability and stability of the ramp function itself. Accuracy is a function of the accuracy of these same circuits. Since these circuits can be obtained with a high degree of precision, accuracy and stability, the problems associated with logarithmic components, such as drift in logarithmic diodes and logarithmic amplifiers, are avoided by the present invention. The present invention is an analytically correct rather than an approximate curve-fit characteristic of much of the prior art, and is a very exact conversion method limited only by the degree of precision of the few basic components. Another advantage of the present invention over prior art digital systems is that it is operable substantially in real time and does not require any delays in processing digital signals. A great advantage over prior nondigital conversion systems is that the present invention is capable of processing analog input signals over a fairly unlimited range of decade levels.

The above objects, advantages and features of the method of the present invention, as well as others, are accomplished by providing apparatus for and method of converting an input logarithmic signal to an antilog output signal. Conversion is accomplished by generating a timing signal having a predetermined cycle and generating a first linear ramp signal beginning with the start of the timing signal. Coincidence between the ramp signal and the input signal is then detected. An exponential signal which has a duration beginning when coincidence occurs between the ramp signal and the input signal and terminating when the timing signal reaches the end of the predetermined cycle is then generated, the exponential signal asymptotically approaching a predetermined amplitude with a time constant of predetermined value. The exponential signal has an initial amplitude which can be arbitrarily set at any base level such as ground, but which is preferably related to the value of the linear ramp at coincidence. There is then generated a second linear ramp signal which has an instantaneous absolute value of slope determined in accordance with the instantaneous absolute value of slope of the first ramp signal and beginning at the point where the exponential signal reached the end of the predetermined cycle, the initial amplitude of the second ramp being established in accordance with the amplitude of the exponential signal at cycle end. Lastly, one detects coincidence between the second ramp signal and a reference signal which has an amplitude value determined in accordance with the base level previously noted, or which indeed may be the input signal itself. The time period between the beginning of the second ramp signal and its coincidence with the reference signal is the desired antilog output signal and if the time period is a clock count, then the output signal is digital.

The objects, advantages and features of the apparatus of the present invention, as well as others, are accomplished by providing an antilog converter in which a logarithmic input signal is converted to an output signal which is the antilog of the input signal, the converter comprising means for providing a timing signal having a predetermined cycle; means for generating a first ramp signal starting at the beginning of the cycle. Means are provided for comparing the ramp and input signal to determine when coincidence occurs between them. The device includes means for generating an exponentially varying signal commencing at coincidence of the ramp and input signals and continuing until the timing signal reaches the end of the predetermined cycle, the asymptotic amplitude and time constant of the exponential signal having a predetermined value. Also included are means for generating a second ramp signal of instantaneous absolute value of slope determined in accordance with the instantaneous absolute value of slope of the first ramp signal beginning from the point where the exponential signal reached the end of the predetermined cycle, and having an initial value in accordance with the value of the exponential signal at the end of the cycle. Finally, the device comprises means for determining coincidence between the second ramp signal and a reference signal having an amplitude value determined in accordance with the value of the input signal and means for measuring the time interval between the cycle end and the latter coincidence, thereby converting the input logarithmic signal to an antilog output signal.

Other objects of the invention will, in part, be obvious and will, in part, appear hereinafter. The invention accordingly comprises the method involving the several steps and the relation and order of one or more of such steps with respect to each of the others and the apparatus possessing the construction, combination of elements, and arrangement of parts which are exemplified in the following detailed disclosure, and the scope of the application of which will be indicated in the claims.

For a fuller understanding of the nature and objects of the present invention, reference should be made to the following detailed description taken in connection with the accompanying drawings wherein.

Figure 1:
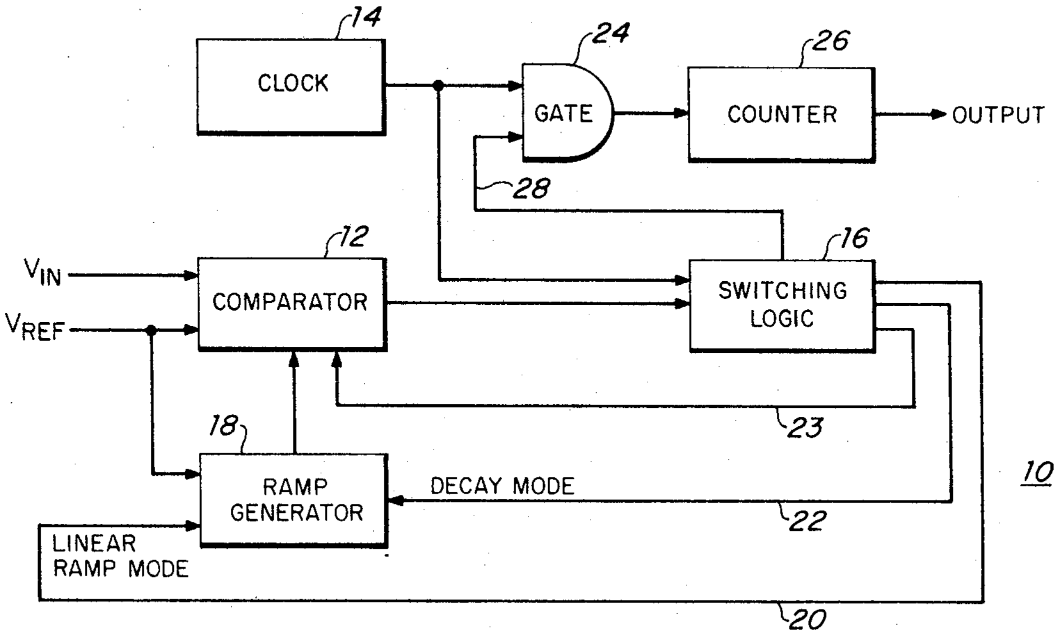
FIG. 1 is a block diagram of a preferred embodiment of an analog to antilog signal converter in accordance with the present invention.

In FIG. 1 there is shown a preferred embodiment of a signal converter 10 in accordance with the present invention including a comparator circuit 12 which may be any standard type of coincidence detector and to an input of which there is applied an analog input signal $V_{in}$. The input analog signal may be any signal which can be analyzed in a logarithmic mode. Clock circuit 14 is included for providing system timing and thus produces a train of clock pulses. Clock circuit 14 may be set to perform a repetitive clocking cycle which cycle is repeated after the predetermined clocking cycle has been completed. This cycle provides the timing for synchronous operation of converter 10. Clock circuit 14 is connected to switching logic 16 which may be a simple switching network.

A ramp generator 18 is provided which may be of any well known design. Ramp generator 18 is used to generate linear ramp signals and also to provide decaying exponential signals. A connection 20 is provided between the output of switching logic 16 and ramp generator 18 so that upon receipt of a signal on connection 20 from switching logic 16, ramp generator 18 generates a linear ramp which increases toward the input signal $V_{in}$. Another connection 22 is provided between the output of switching logic 16 and ramp generator 18 so that upon receipt of a signal on connection 22 from switching logic 16 the capacitor in an RC network (not shown) in ramp generator 18 is allowed to decay thereby providing a signal which varies exponentially with time and having an asymptotic charging amplitude and time constant of predetermined value. Another connection 23 is provided between the output of switching logic 16 and comparator 12. A reference level signal $V_{ref.}$, is connected to both comparator 12 and ramp generator 18. $V_{ref.}$ has a predetermined relationship with input signal, $V_{in}$. $V_{ref.}$ may be a reference level which has the same amplitude value as the input signal, it may be ground or it may have some scalar relationship to the amplitude value of the input signal.

The output of comparator circuit 12 is connected to switching logic 16. The output of clock circuit 14 is connected to an AND-gate 24 whose output is connected to counter 26. The output of clock circuit 14 is also connected to switching logic 16. An output on connection 28 is provided from switching logic 16 to gate 24.

The general operation of the embodiment of the invention shown in FIG. 1 as follows. At a time $t_0$, clock circuit 14 begins its predetermined clocking cycle. The initiation of the clocking cycle causes switching logic 16 to initiate operation of ramp generator 18 via connection 20 to begin generating a linear ramp which increases toward the input signal $V_{in}$. Switching logic 16 applies a signal on connection 23 to comparator 12 to allow comparator 12 to compare $V_{in}$ with the first linear ramp. The ramp signal and $V_{in}$ are compared by comparator 12 and at coincidence between the ramp signal and $V_{in}$ at a time $t_1$, an output signal is applied from comparator 12 to switching logic 16. This signal causes switching logic 16 to switch its output from connection 20 to connection 22 so as to stop the generation of the ramp signal and to allow the capacitor of the RC network to decay exponentially. This decaying exponential signal has an initial asymptotic charging amplitude and time constant determined by the value of $V_{ref.}$ and the capacitance of the RC network capacitor. The exponential decay continues until the end of the predetermined clocking cycle is reached at a time $t_2$ at which time the clocking cycle starts over. The reinitiation of the start of the clocking cycle causes switching logic 16 to apply a signal on connection 28 to gate 24 so as to open gate 24 and allow counter 26 to feed a display. Simultaneously with the reinitiation of the start of the clocking cycle, switching logic 16 causes its output to switch from connection 22 back to connection 20 to initiate a second linear ramp having identical slope and direction to that of the first ramp. The initial amplitude of this second ramp is the same as the amplitude that was reached by the decaying exponential signal. Switching logic 16 applies a signal on connection 23 to comparator 12 to allow comparator 12 to compare $V_{ref.}$ (the voltage on the capacitor at the beginning of exponential discharge) with the second linear ramp. When the amplitude value of the second linear ramp coincides with $V_{ref.}$, an output signal is applied from comparator 12 to switching logic 16 which removes the output signal from connection 28 to gate 24, thereby closing the gate and stopping counter 26 at time $t_3$. The time period from $t_2$ to $t_3$ which was counted by counter 26 is proportional to the antilog output signal which is representative of the mantissa of the logarithmic analog input signal $V_{in}$, as will be shown mathematically in conjunction with the embodiment in FIG. 2 and the diagrams in FIGS. 3 and 4.

Figure 2:
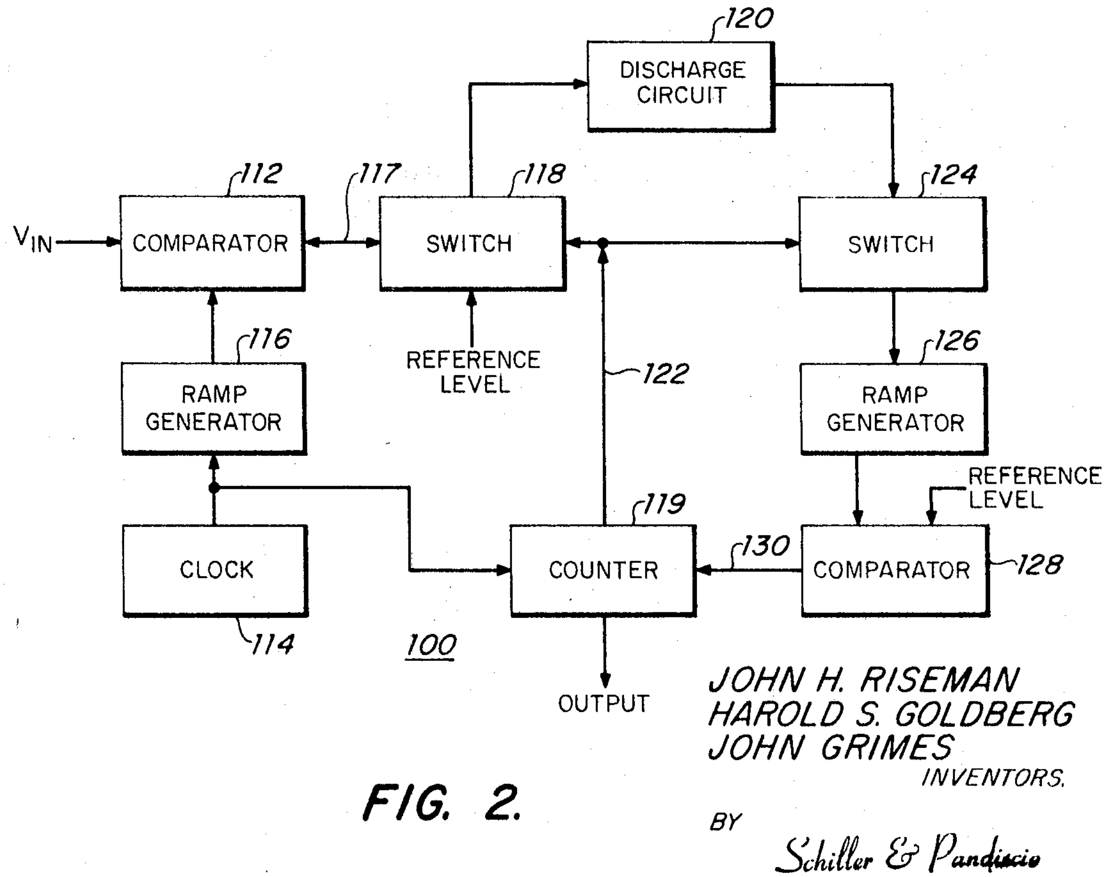
FIG. 2 is a block diagram of an alternative embodiment of the present invention.

FIG. 2 shows an alternative embodiment of a signal converter 100 in accordance with the present invention in which a pair of comparators and a pair of ramp generators are used. Converter 100 includes a first comparator circuit 112 which may be a standard type of coincidence detector and to an input of which there is applied input signal $V_{in}$. The later typically is a logarithmic function of the parameter to be measured. The input analog signal may be any signal which can be analyzed in a logarithmic mode. Clock circuit 114 is included for providing system timing and thus produces a train of clock pulses. Clock circuit 114 may be set to perform a repetitive counting cycle which cycle is repeated after the predetermined clocking cycle has been completed. This cycle provides the timing for synchronous operation of converter 100. Clock circuit 114 is connected to a first ramp signal generator 116 which in this embodiment is used to generate a linear ramp. "Ramp" signal is used here, however, to include any signal which varies either linearly or nonlinearly as a function of time.

The output of comparator circuit 112 is connected on line 117 to switch 118. An output from circuit 114 is also applied to counter 119 whose purpose is to count the clock signal from its start through each predetermined clocking cycle. The closing of switch 118 connects a DC reference level to charge/discharge circuit 120 which is used to generate either a charging or discharging function which varies exponentially with time. The charge/dishcarge circuit 120 may be, for example, a simple RC network.

An output of counter 119 is connected to switch 118 to reopen switch 118 at a predetermined time. This output is also connected to switch 124 so that at the same time switch 118 is opened, switch 124 closes to connect the output of the charge/discharge circuit 120 to a second ramp signal generator 126, which may be any type of well known such generator. The output of second generator 126 is connected to a second comparator 128 to which is also applied a reference level signal which is the initiating voltage on the capacitor at the start of exponential discharge. Comparator 128 may be any standard coincidence detector. The output of comparator 128 is connected to counter 119.

Figure 3:
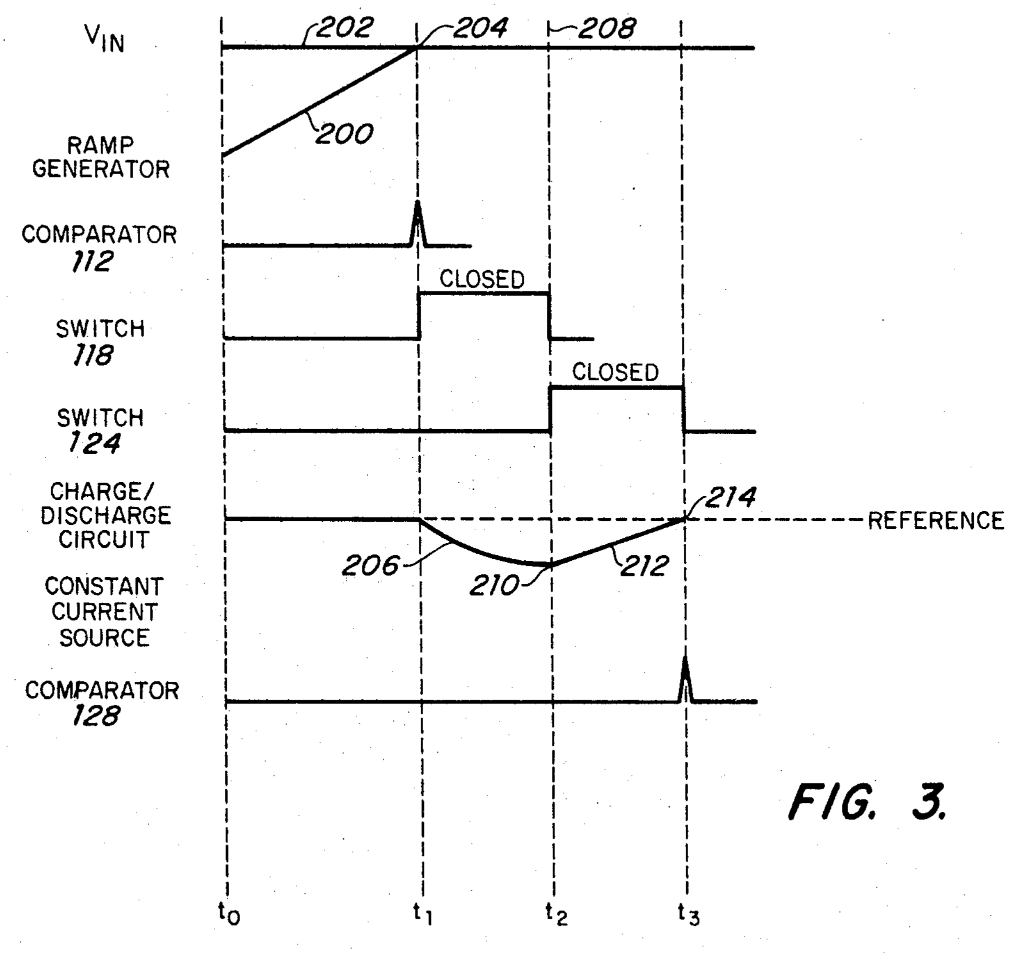
FIG. 3 is a timing diagram illustrating the operation of the method and apparatus shown in FIG. 2 of the present invention.
Figure 4:
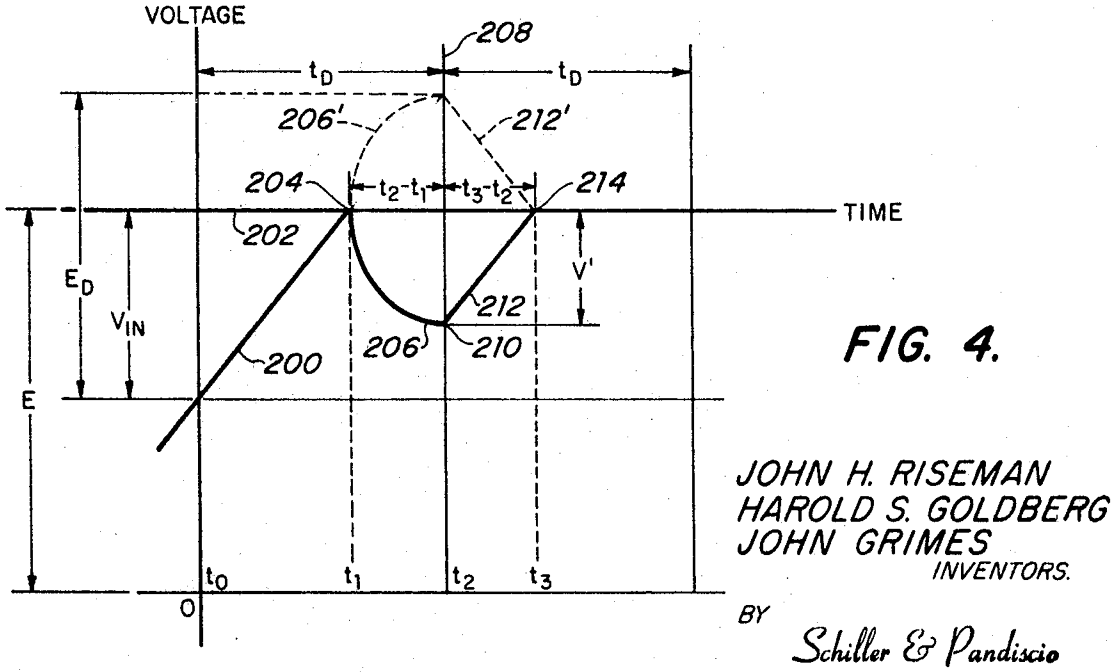
FIG. 4 is a plot of voltage vs. time showing the present invention used in a particular application to convert an input analog logarithmic signal to a digital antilog output signal.

The operation of the analog to antilog signal converter of the present invention will be described in conjunction with its use, for example, in electrochemically measuring the concentration of certain types of ions in solution by use of an electrochemical detector. Measuring ion concentration in such manner produces electrical signals having a logarithmic component. FIG. 3 is a series of voltage vs. time diagrams showing the signals derived from each of the components in FIG. 2, and FIG. 4 is an overall plot of voltage vs. time indicating the operation of the present invention in this environment. In both of these figures, circuit 120 is assumed to be providing an exponential decay or discharge function. However, it should be understood that an exponential charge function could just as easily be utilized. The voltage developed in the above-described application is of the type resulting from the well-known Nernst effect. The Nernst equation is:

$$V_{in}=E_o+K \log A \qquad (1)$$

where $V_{in}$ is the input voltage measured by the detector and having a constant component voltage $E_o$ and a component consisting of a constant $K$ determined by the particular solution being measured and a logarithm of the ionic activity $A$ solution. The logarithmic component of the equation is the term to be analyzed and the output signal is the argument or antilogarithm of the logarithmic term.

For purposes of the description, it will be assumed that the clock circuit 114 will be cycled in decades with each decade $t_0$ containing approximately 900 counts. However, the decade may contain any preassigned number of counts and also it is not necessary to count in decades. Any number base will work as long as the counts are whole counts. Also, it should be noted that counting may take place in either an increasing or decreasing set of numbers. In other words, with increasing time, the counter can be arranged to count up or down depending on the application involved. In this instance assume the count increases so that the first decade will count from $1.00\times10^0$ to $9.99\times10^0$, the second decade will count from $1,00\times10^1$ to $9.99\times10^1$, and so on. The linear ramp generated by ramp generator 116 has a slope such that for each successive decade $t_D$, the ramp signal increases an incremental voltage $E_D$ which in this example is calibrated at 60 millivolts.

At time $t_o$, the ramp generator 116 begins to generate the linear ramp signal illustrated by sloped line 200. $V_{in}$ defined in equation (1) above is shown as a voltage line labeled 202. When ramp voltage 200 coincides in absolute value with $v_{in}$ as shown at point 204 as detected by comparator circuit 112 at a time $t_1$, switch 118 is closed thereby initiating operation of exponential discharging circuit 120 by allowing the charge built up on the capacitor of the RC network (not shown) to decay exponentially from the reference level. The reference level may be selected so as to initiate the exponential decay at an initial amplitude value which may or may not be the same as the amplitude value of the ramp signal at the time of coincidence, $t_1$, with the input signal $V_{in}$. "Coincidence" in the context of this invention means that the absolute value of the amplitude of one signal bears a scalar relationship to the absolute value of the amplitude of the other signal such that one is a real number multiple or submultiple of the other. Typically, such multiple is unity in which case the values are then the same. The output of charge circuit 120, which is an RC network, is an exponential signal 206 having RC time constant, $\tau$. The exponential signal 206 in this example has an initial amplitude value the same as the amplitude value of the input signal at the time of coincidence with the ramp signal 200 and is generated until the clock circuit 114 reaches the end of its 900 count cycle shown at vertical line 208 at a time $t_2$. When the end of the cycle is reached at time $t_2$, counter 119 passes through a decade, and the signal resulting from this event is applied on a line 122 to switch 118 which is opened by this signal to stop the decaying exponential signal. This signal is simultaneously applied to normally open switch 124 to close this switch.

The voltage $v'=E\left[1-e\left[-\frac{t_2-t_1}{\tau}\right]\right] \qquad (2)$

From FIG. 4, it is evident that the following proportionality exists:

$$t_D-(t_2-t_1)/t_D V_{in}/E_D \qquad (3)$$

Solving for $(t_2-t_1)$ $$(t_2-t_1)=\left(1-\frac{V_{in}}{E_D}\right)t_D$$

where$K^A$ is equal to $t_D$ and $K_B$ is equal to $t_D/E_D$.

$$(t_2-t_1)=K_1=K_2 \log A \qquad (4)$$

where $K_1$ is equal to $(K_A-K_BE_o)$ and $K_2$ is equal to $(-K_BK)$.

Substituting equation (4) in equation (2), $v'$ becomes:

$$(t_2-t_1)=K_A-K_B[E_o+K \log A]$$

$$v'=E\left[1-e^{\frac{-(K_1+K_2 \log A)}{\tau}}\right]$$

$$v'=E\left[1-e^{-\left(\frac{K_1}{\tau}\right)}.'e^{-\left(\frac{K_2 \log A}{\tau}\right)}\right]$$

$$v'=E\left[1-K'_1Ae^{-\left(\frac{K_2}{\tau}\right)}\right] \qquad (5)$$

By definition $$-\frac{K_2}{\tau}=1$$

so that $$v'=E[1-K'_1A)] \qquad (6)$$

The value provided by $v'$ is no longer in logarithmic form but is an antilog signal. When the exponential signal 206 reaches point 210 at the end of the decade cycle of 900 counts at time $t_2$ as represented by line 208, switch 118 is opened while switch 124 is closed thereby initiating operation of second ramp generator 126. Ramp generator 126 provides the linear charge ramp signal 212 which has an identical absolute value of slope of 60 mv./decade as ramp signal 200 and an initial amplitude value which is the same as the amplitude value of the exponential signal 206 at the end of the decade cycle. At a time $t_3$ ramp signal 212 reaches the reference level at point 214 which is detected by comparator circuit 128. The reference level has an amplitude value which is substantially the same as the initial amplitude value of the exponential signal. When coincidence is detected, an output is provided from comparator circuit 128 on a line 130 to counter 119 to stop the count. The time period $(t_3-t_2)$ from the end of the decade cycle shown at line 208 to coincidence of the ramp signal 212 and the reference level, which in this case has the same amplitude value as shown as the intersection of ramp 212 at point 214 on line 202, is proportional to the digital antilog output signal representative of the logarithmic analog input signal, $V_{in}$.

Although the embodiments shown have been described such that the first linear ramp 200 increases toward the input analog signal $V_{in}$, any predetermined reference level may be established for comparison with linear ramp 200. Also, FIGS. 3 and 4 show that the two linear, identically shaped ramps 200 and 212 function unidirectionally, i.e., they both increase in the same direction. This unidirectionality for the two ramps 200 and 212 is preferable because of the existence of hysteresis bands through which the signals must pass when level comparisons are made. The result is more accurate if the ramps both pass through this hysteresis band from the same direction. However, the method will work, although less accurately, if the ramps have identical slopes but do not ramp unidirectionally. In such an embodiment the exponential signal would charge from point 204 as shown by dashed function 206', and the second ramp signal would have identical absolute slope value as ramp function 200 but would ramp as shown by dashed line 212'.

Although FIG. 2 has been described as providing a digital antilog output signal, it should be realized that the output signal need not be a digital signal but may be an analog signal. The primary function is the conversion of an analog input signal to an antilog output signal which is provided by the counts registered on counter 119 of the time period ($t_3$–$t_2$). Also, though the ramp signals have been described as linear, it is conceivable that the invention could also be applicable to nonlinear ramp signals.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A device for determining the antilog of an input analog signal, said device comprising:
   - means for providing a timing signal having a predetermined timing cycle;
   - means for generating coincidentally with the start of said timing signal a first signal, the amplitude of which varies as a function of time;
   - means for detecting coincidence between said first signal and said input signal;
   - means for generating a second signal, the amplitude of which varies exponentially with time, said second signal beginning at a reference level when coincidence occurs between said first signal and said input signal and having an asymptotic charging amplitude and time constant of predetermined value;
   - means for generating a third signal, the amplitude of which varies as a function of time and which has an instantaneous absolute value of slope determined in accordance with the instantaneous absolute value of slope of said first signal, said third signal beginning at the end of said predetermined cycle, said third signal having an initial absolute amplitude value determined in accordance with the absolute amplitude value of said second signal at the end of said predetermined cycle;
   - means for detecting coincidence between said third signal and said reference level; and
   - means for measuring the time period from the end of said predetermined cycle to the time when said coincidence occurs between said third signal and said reference level, said time period being proportional to said antilog of the input signal.

2. A device as defined in claim 1 wherein said first and third signals are substantially linear ramp signals.

3. A device as defined in claim 1 wherein said means for measuring said time period is adapted to provide the latter as a digital count.

4. A device as defined in claim 1 wherein said third signal has an initial absolute value which is a predetermined multiple of the absolute amplitude value of said second signal at the end of said predetermined cycle.

5. A device as defined in claim 1 wherein said second signal has an initial absolute amplitude value which is substantially the same as the absolute value of amplitude of said first signal at the time of coincidence between said first signal and said input signal.

6. A device as defined in claim 5 wherein said third signal has an initial value which is substantially the same as the absolute amplitude value of said second signal at the end of said predetermined cycle.

7. A device as defined in claim 1 wherein said reference level has substantially the same amplitude value as the absolute amplitude value of said first signal at the time of coincidence between said first signal and said input signal.

8. A device as defined in claim 1 including means for generating an output signal proportional to said time period.

9. An analog-to-digital antilog converter for converting an input analog logarithmic signal to a digital antilog output signal, said converter comprising:
   - a clock circuit for providing a clocking signal having a predetermined cycle:
   - a first linear ramp generator connected to said clock circuit for generating a first ramp signal beginning at the start of said cycle;
   - a first comparator circuit to which said input signal and ramp signal are applied for determining coincidence between said input signal and ramp signal;
   - means coupled to the output of said first comparator circuit for generating a signal which varies exponentially with time when coincidence occurs between said ramp signal and input signal, said exponential signal having an asymptotic charging amplitude and time constant of predetermined value;
   - a second linear ramp generator coupled to the output of said clock circuit for providing a second ramp signal having absolute value of slope determined in accordance with the instantaneous absolute value of slope of said first ramp signal and beginning at the end of said predetermined cycle, said second ramp signal having an initial absolute amplitude value in accordance with the absolute amplitude value of said exponential signal at the end of said cycle;
   - a second comparator circuit coupled to the output of said second ramp generator for determining coincidence between said second ramp signal and a reference signal having an amplitude value determined in accordance with the value of said input signal; and
   - means for counting, in accordance with said clock, the time period from the end of said predetermined cycle to the time when a predetermined coincidence occurs between said second ramp signal and said reference signal, said time period being proportional to the antilog of said input signal.

10. A converter as defined in claim 9 wherein:

said exponential signal generating means includes
   - a source of potential;
   - charging means for generating said exponential signal;
   - a first normally open switching means for connecting the output of source of potential to the input of said charging means, said switching means being closed by the signal from said first comparator circuit when coincidence occurs between said input signal and said first ramp signal to initiate operation of said charging means; and
   - a second normally open switching means coupled to the output of said charging means and said counting means, said first switching means being opened and said second switching means being closed when said counting means is automatically reset at the end of said predetermined cycle to initiate operation of said second ramp generator.

11. A converter as defined in claim 9 wherein said second ramp signal has an instantaneous value of slope substantially the same as that of said first ramp signal and an initial value which is substantially the same as the absolute amplitude value of said exponential signal at the end of said predetermined cycle, and wherein said reference signal has substantially the same amplitude value as the initial amplitude value of said exponential signal.

12. A method of converting an input analog signal to an antilog output signal, and comprising the steps of:
   - generating a timing signal having a predetermined cycle;
   - generating coincidentally with the start of said timing signal a first signal the amplitude of which varies as a function of time;
   - detecting coincidence between said first signal and said input signal;
   - generating a second signal, the amplitude of which varies exponentially with time, said second signal beginning when coincidence occurs between said first signal and said input signal and having an asymptotic charging amplitude from a base level, and a time constant of predetermined value;

generating a third signal, the amplitude of which varies as a function of time and which has an instantaneous absolute value of slope determined in accordance with the instantaneous absolute value of slope of said first signal, said third signal beginning at the end of said predetermined cycle, said third signal having an initial absolute amplitude value determined in accordance with the absolute amplitude value of said second signal at the end of said predetermined cycle;

detecting coincidence between said third signal and said base level;

measuring the time period from the end of said predetermined cycle to the time when said coincidence occurs between said third signal and said base level; and generating said output signal proportional to said time period.

* * * * *